United States Patent
Ross et al.

(10) Patent No.: US 8,778,755 B2
(45) Date of Patent: Jul. 15, 2014

(54) METHOD FOR FABRICATING A METAL-INSULATOR-METAL CAPACITOR

(75) Inventors: Jason F. Ross, Haymarket, VA (US); Chi-Hua Yang, Manassas, VA (US); Thomas J. McIntyre, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 43 days.

(21) Appl. No.: 13/547,571

(22) Filed: Jul. 12, 2012

(65) Prior Publication Data

US 2014/0017872 A1    Jan. 16, 2014

(51) Int. Cl.
*H01L 21/02*    (2006.01)

(52) U.S. Cl.
USPC ............................. 438/253; 438/240; 438/397

(58) Field of Classification Search
USPC ........... 257/E21.343, E21.647; 438/253, 259, 438/397, 240
See application file for complete search history.

(56) References Cited

U.S. PATENT DOCUMENTS

| | | | | |
|---|---|---|---|---|
| 6,319,767 B1 * | 11/2001 | Cha et al. | ....................... | 438/250 |
| 6,713,395 B2 * | 3/2004 | Ning | ............................ | 438/694 |
| 6,958,544 B2 * | 10/2005 | Sunohara | ...................... | 257/758 |
| 7,501,686 B2 * | 3/2009 | Okuno et al. | .................. | 257/369 |
| 8,048,735 B2 * | 11/2011 | Takeda et al. | ................. | 438/240 |

* cited by examiner

*Primary Examiner* — John C Ingham
(74) *Attorney, Agent, or Firm* — Yudell Isidore Ng Russell; Anthony Ng

(57) ABSTRACT

A method for fabricating a metal-insulator-metal capacitor (MIMCap) is disclosed. A first metal layer is provided on top of an oxide layer. A nitride layer is then deposited on the first metal layer. The nitride layer and the first metal layer are etched to form a MIMCap metal layer. The gaps among the MIMCap metal layer are filled with a plasma oxide, and the excess plasma oxide is polished using the nitride layer a polish stop. After removing the nitride layer, a dielectric layer and a second metal layer are deposited on the MIMCap metal layer. Finally, the dielectric layer and the second metal layer are etched to form a set of MIMCap structures.

6 Claims, 3 Drawing Sheets

METHOD FOR FABRICATING A METAL-INSULATOR-METAL CAPACITOR

BACKGROUND OF THE INVENTION

1. Technical Field

The present invention relates to semiconductor devices having a stacked metal-insulator-metal capacitor in general, and in particular to a method for fabricating a stacked metal-insulator-metal capacitor.

2. Description of Related Art

As the size of integrated circuits becomes smaller and smaller, capacitors used in memory storage cells need to have a higher capacitance per unit area. One technique of increasing capacitance per unit area is by changing capacitors from their typical polysilicon-insulator-polysilicon configuration to a metal-insulator-metal (MIM) configuration.

A metal-insulator-metal capacitor (MIMCap) is a specific type of capacitor having a dielectric layer embedded within two metal plates that are parallel to a semiconductor wafer surface. The MIMCap process flow typically contains a metal stack/cap oxide/metal stack integrated into a back-end-of-the-line (BEOL) structure. In addition to higher capacitance per unit area, MIMCaps also provide radiation hardening for memory devices as well as other integrated circuit devices.

The current MIMCap process flow requires an entire stack to be deposited at once and the metal films are subsequently patterned. As a result, defects are allowed to form since the upper levels are patterned and etched first, which makes the wafer non-planar and much more difficult for the lowest (i.e., the most critical) metal layer to be patterned. Also, defects formed during the patterning of the upper metal layer can cause defects on the lower metal layer due to micromasking.

Consequently, it would be desirable to provide an improved method for fabricating MIMCaps.

SUMMARY OF THE INVENTION

In accordance with a preferred embodiment of the present invention, a first metal layer is provided on top of an oxide layer. A nitride layer is then deposited on the first metal layer. The nitride layer and the first metal layer are etched to form a first metal-insulator-metal capacitor (MIMCap) metal layer. The gaps among the first MIMCap metal layer are filled with a plasma oxide, and the excess plasma oxide is polished using the nitride layer a polish stop. After removing the nitride layer, a dielectric layer and a second metal layer are deposited on the first MIMCap metal layer. Finally, the dielectric layer and the second metal layer are etched to form a set of MIMCap structures.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
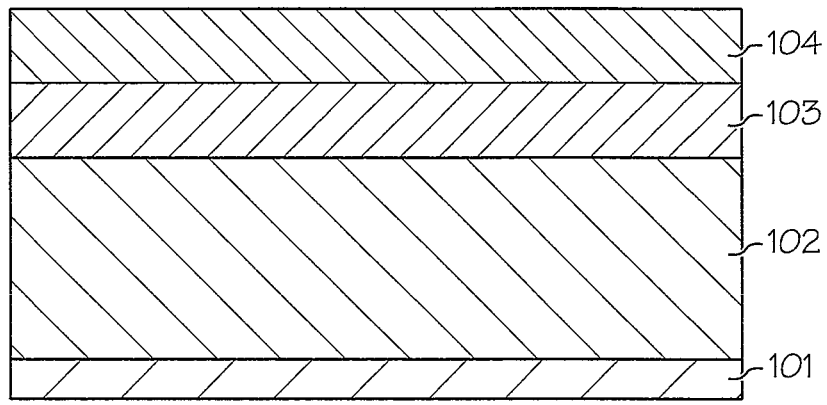
FIGS. 1-7 are high-level process flow diagrams of a method for fabricating a metal-insulator-metal capacitor, in accordance with a preferred embodiment of the present invention.

Referring now to the drawings and in particular to FIG. 1, there is illustrated a method for fabricating a metal-insulator-metal capacitor (MIMCap), in accordance with a preferred embodiment of the present invention. The process begins with an initial structure having a silicon substrate 101, a buried oxide (BOX) layer 102, a metal layer 103 and a nitride layer 104, as shown in FIG. 1. Metal layer 103 is preferably a stack of titanium/titanium nitride/aluminum copper/titanium/titanium nitride with titanium nitride being the top layer. For example, metal layer 103 may include 150 Å Ti, 200 Å TiN, 4,000 Å AlCu, 44 Å Ti and 375 Å TiN. Nitride layer 104, which is approximately 300 Å thick, can be silicon nitride ($Si_3N_4$) or silicon oxynitride ($SiO_xN_x$).

Figure 2:
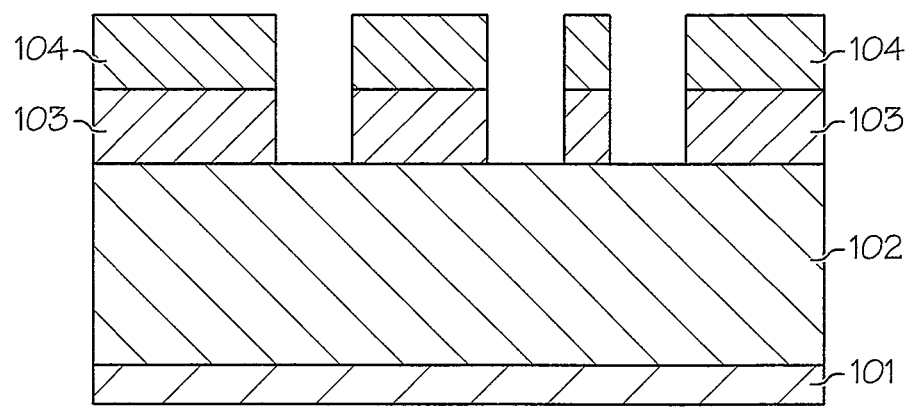

A photoresist layer is then placed on top of nitride layer 104 to etch metal layer 103. After the etching has been completed and the photoresist layer has been removed, metal layer 103 is fully patterned, as shown in FIG. 2.

Figure 3:
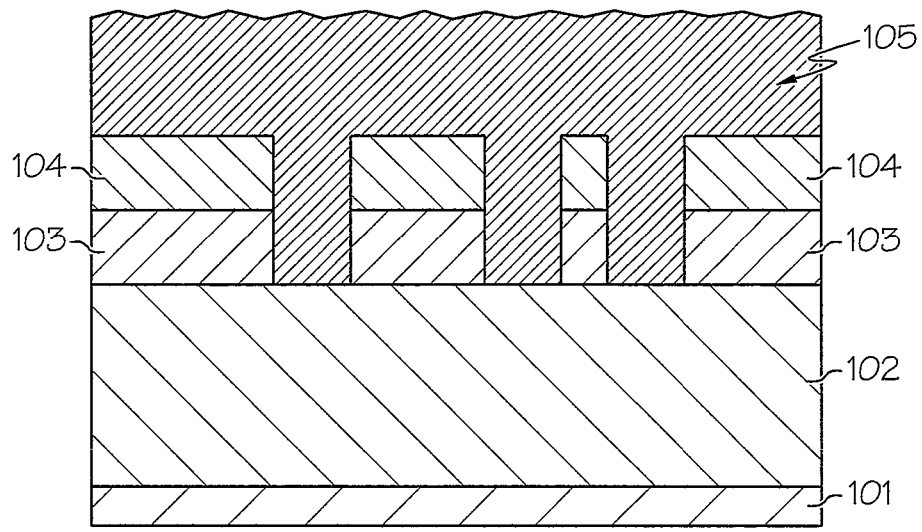
Figure 4:
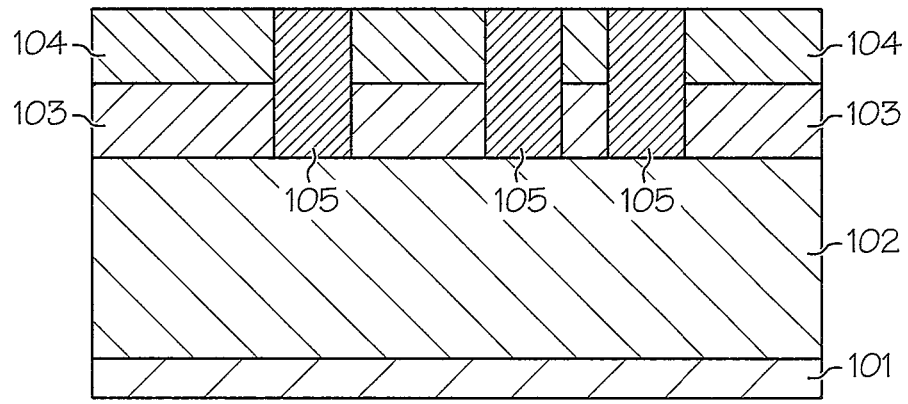

Next, a high-density plasma (HDP) oxide layer 105 is deposited to fill in the gaps between metal lines of metal layer 103, as shown in FIG. 3. A chemical mechanical polishing (CMP) step is then performed on HDP oxide layer 105 to planarized the surface of HDP oxide layer 105. During the etch step, nitride layer 104 serves as a hard mask for metal layer 103. During the CMP step, nitride layer 104 serves as a polish stop. As a result, the polishing can stop on the surface of nitride layer 104 without dishing or corrosion of the metal layer 103 using a cerium oxide polish slurry, as shown in FIG. 4.

Figure 5:
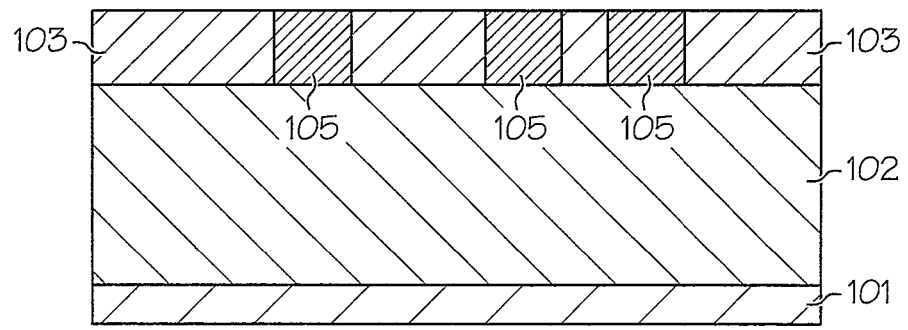

A blanket plasma etching (using CF4 and oxygen) step is then utilized to remove nitride layer 104. At this point, the surface of metal layer 103 is still planarized. The blanket plasma etching step removes nitride layer 104 without creating any height difference due to the non-selective etch chemistry between nitride layer 104 and oxide layer 102. The blanket plasma etch is selective to metal and does not damage metal layer 103. At this point, metal layer 103 is exposed with no dielectric on its top surface, as shown in FIG. 5.

Figure 6:
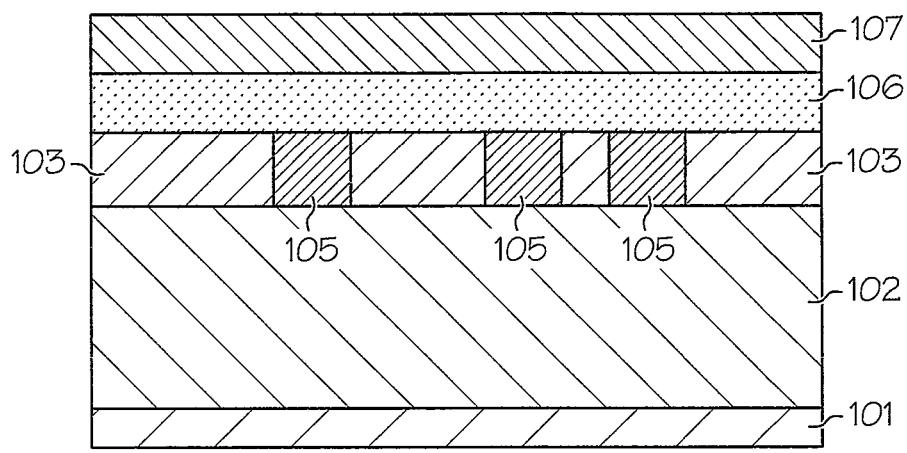

Next, an insulator dielectric layer 106 is deposited on top of metal layer 103, and a metal layer 107 is then deposited on top of dielectric layer 106, as shown in FIG. 6. Dielectric layer 106 can be an oxide layer or nitride layer.

Figure 7:
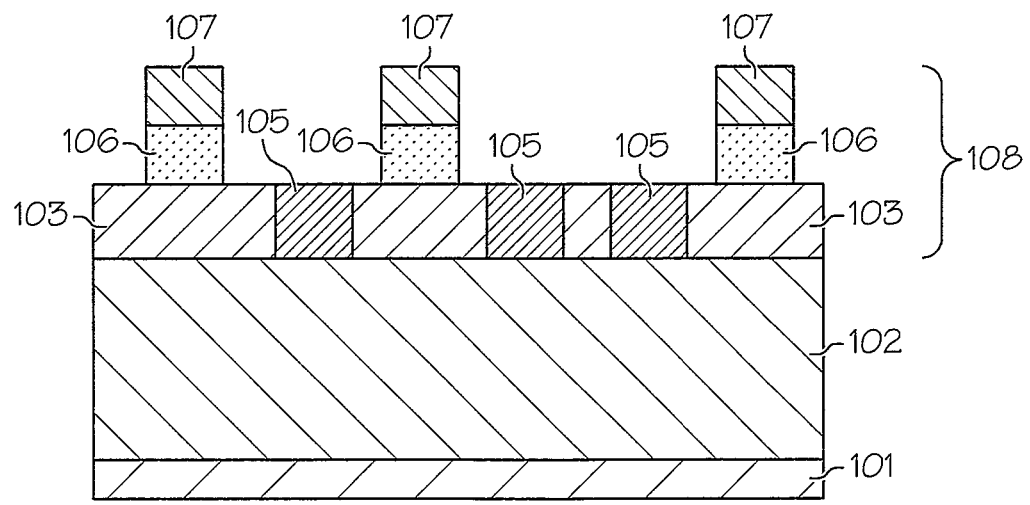

Subsequently, dielectric layer 106 and metal layer 107 are patterned and etched, and various MIMCap structures 108 are formed. Each of MIMCap structures 108 includes metal layer 107, dielectric layer 106 and metal layer 103, as shown in FIG. 7.

As has been described, the present invention provides an improved method for fabricating MIMCaps. The method of the present invention provides a planarized MIMCap structure without the inherent problems of the conventional process flow.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a metal-insulator-metal capacitor (MIMCap), said method comprising:

providing a first metal layer on top of a first oxide layer;

depositing a nitride layer on said first metal layer;

etching a plurality of trenches through said nitride layer and first metal layer, wherein said first metal layer forms a MIMCap metal layer;

filling said trenches within said nitride layer and said first metal layer with a plasma oxide;

polishing said plasma oxide using said nitride layer as a polish stop such that said plasma oxide is planar with said nitride layer;

removing said nitride layer to expose said first metal layer;

depositing a dielectric layer and a second metal layer on said MIMCap metal layer; and etching said dielectric layer and said second metal layer to form a plurality of MIMCap structures.

2. The method of claim 1, wherein said metal layer includes titanium, titanium nitride, and aluminum copper.

3. The method of claim 1, wherein said nitride layer is silicon nitride.

4. The method of claim 1, wherein said nitride layer is silicon oxynitride.

5. The method of claim 1, wherein said polishing is performed using a cerium oxide polish slurry.

6. The method of claim 1, wherein said removing is performed using CF4 and oxygen.

* * * * *